(12) United States Patent
Krill et al.

(10) Patent No.: US 12,360,643 B2
(45) Date of Patent: Jul. 15, 2025

(54) PUMP HAVING A CONTROL PANEL

(71) Applicant: KSB SE & Co. KGaA, Frankenthal (DE)

(72) Inventors: David Krill, Frankenthal (DE); Fred Brueckmann, Frankenthal (DE); Federico Di Santo, Sossano (IT); Mattia Liboni, Pojana Maggiore (IT); Carlo Prearo, Nanto (IT)

(73) Assignee: KSB SE & Co. KGaA, Frankenthal (DE)

( * ) Notice: Subject to any disclaimer, the term of this patent is extended or adjusted under 35 U.S.C. 154(b) by 0 days.

(21) Appl. No.: 18/278,117

(22) PCT Filed: Feb. 21, 2022

(86) PCT No.: PCT/EP2022/054236
§ 371 (c)(1),
(2) Date: Aug. 21, 2023

(87) PCT Pub. No.: WO2022/175521
PCT Pub. Date: Aug. 25, 2022

(65) Prior Publication Data
US 2024/0126397 A1 Apr. 18, 2024

(30) Foreign Application Priority Data
Feb. 22, 2021 (DE) .................... 10 2021 000 932.0

(51) Int. Cl.
*H10K 50/84* (2023.01)
*F24F 1/0022* (2019.01)
(Continued)

(52) U.S. Cl.
CPC .......... *G06F 3/0448* (2019.05); *G06F 3/0362* (2013.01); *G06F 3/0416* (2013.01);
(Continued)

(58) Field of Classification Search
CPC .... G06F 3/0448; G06F 3/0362; G06F 3/0416; G06F 3/03547; G06F 3/04164;
(Continued)

(56) References Cited

U.S. PATENT DOCUMENTS 4,462,752 A * 7/1984 Laing .................. F04D 29/4293
417/423.1
6,137,416 A * 10/2000 Meador ............... A61M 60/538
340/611

(Continued)

FOREIGN PATENT DOCUMENTS

DE 10 2006 037 545 A1 3/2008
DE 10 2006 046 202 A1 4/2008
(Continued)

OTHER PUBLICATIONS

International Search Report (PCT/ISA/210) issued in PCT Application No. PCT/EP2022/054236 dated Jun. 9, 2022 with English translation (5 pages).
(Continued)

*Primary Examiner* — Mihir K Rayan
(74) *Attorney, Agent, or Firm* — Crowell & Moring LLP

(57) ABSTRACT

A pump, in particular a centrifugal pump, includes a control panel for manually operating and/or configuring the pump. The control panel includes at least one touch-sensitive surface for user inputs, and at least one film for sealing the touch-sensitive surface from the environment applied on the touch-sensitive surface. The control panel may include features such as light sources, preferably arranged in a ring simulating a mechanical adjustment wheel.

21 Claims, 3 Drawing Sheets

(51) Int. Cl.
*G06F 3/0354* (2013.01)
*G06F 3/0362* (2013.01)
*G06F 3/041* (2006.01)
*G06F 3/044* (2006.01)
*G06F 3/04847* (2022.01)
*H10K 50/842* (2023.01)
*H10K 50/844* (2023.01)
*F24F 11/65* (2018.01)

(52) U.S. Cl.
CPC ............. *F24F 1/0022* (2013.01); *F24F 11/65* (2018.01); *G05B 2219/2614* (2013.01); *G06F 3/03547* (2013.01); *G06F 3/04164* (2019.05); *G06F 3/044* (2013.01); *G06F 3/04847* (2013.01); *H10K 50/84* (2023.02); *H10K 50/8426* (2023.02); *H10K 50/844* (2023.02)

(58) Field of Classification Search
CPC .... G06F 3/044; G06F 3/04847; F24F 1/0022; F24F 11/65; G05B 2219/2614; H10K 50/84; H10K 50/8426; H10K 50/844
See application file for complete search history.

(56) References Cited

U.S. PATENT DOCUMENTS

| | | | | |
|---|---|---|---|---|
| 7,645,955 | B2* | 1/2010 | Huang | H01H 25/041 200/341 |
| 2006/0165522 | A1* | 7/2006 | Werner | A61M 5/1456 415/206 |
| 2007/0182718 | A1* | 8/2007 | Schoener | B60K 35/25 345/173 |
| 2007/0197951 | A1* | 8/2007 | Mannlein | A61M 5/44 604/6.13 |
| 2008/0036744 | A1 | 2/2008 | Hartl | |
| 2009/0273573 | A1* | 11/2009 | Hotelling | G06F 3/0362 345/173 |
| 2010/0084253 | A1 | 4/2010 | Bollmann et al. | |
| 2010/0247352 | A1* | 9/2010 | Hansen | F04D 29/605 29/888.02 |
| 2013/0052039 | A1* | 2/2013 | Blaser | G04G 15/006 417/12 |
| 2014/0314062 | A1 | 10/2014 | Loebs | |
| 2014/0364178 | A1* | 12/2014 | Hynecek | G06F 1/1637 455/575.8 |
| 2015/0022039 | A1 | 1/2015 | Sofussen et al. | |
| 2020/0063741 | A1 | 2/2020 | Lechner et al. | |

FOREIGN PATENT DOCUMENTS

| | | |
|---|---|---|
| DE | 10 2008 015 385 A1 | 10/2009 |
| EP | 2 573 403 A1 | 3/2013 |
| EP | 3 530 959 A1 | 8/2019 |
| WO | WO 2013/117401 A2 | 8/2013 |

OTHER PUBLICATIONS

German-language Written Opinion (PCT/ISA/237) issued in PCT Application No. PCT/EP2022/054236 dated Jun. 9, 2022 with English translation (6 pages).

German-language Search Report issued in German Application No. 10 2021 000 932.0 dated Nov. 25, 2021 with partial English translation (17 pages).

* cited by examiner

PUMP HAVING A CONTROL PANEL

CROSS REFERENCE TO RELATED APPLICATION

This application claims priority under 35 U.S.C. § 119 from German Patent Application No. 102021000932.0, filed Feb. 22, 2021, the entire disclosure of which is herein expressly incorporated by reference.

BACKGROUND AND SUMMARY OF THE INVENTION

The invention relates to a pump, in particular a centrifugal pump, having a control panel for manual actuation and/or configuration of the pump.

Pumps in different areas of application are either operated centrally via a controller or locally at the pump via a control panel attached there. The latter is typically equipped with mechanical switches or button elements. Depending on the application, for example in heating circulation pumps, a mechanical setting wheel is used via which the operator can perform a direct operation or configuration input via rotational movement. The current rotational position of the setting wheel permits a conclusion about the pump setting performed.

The object of the present invention is to rework the previous operating concept and to offer an innovative solution for the operator.

This object is achieved by a pump having the features of claim 1. Advantageous embodiments are the subject matter of the dependent claims.

It is proposed according to the invention that the control panel be equipped with at least one touch-sensitive surface for performing user input. The operator can, for example, actuate the pump and/or perform possible configuration inputs via this surface. The touch-sensitive surface is equipped as a touchpad, so that the user can ideally make inputs using only their fingers, without further aids. However, it is also conceivable that aids, for example a so-called touch pen, can be used. In addition, a touch-sensitive surface does not require mechanical movement kinematics, as is the case with conventional buttons, switches, etc.

Since pumps are generally used in fluid applications, certain protective measures have to be taken. Splash water protection, in particular the protection type IP44, plays an important role in most pump applications. For this purpose, the touch-sensitive surface of the pump according to the invention is additionally covered using a film that seals off the surface from the surroundings. The film material, in particular plastic, is capable of effectively protecting the underlying surface from the ingress of water, in particular splash water. In addition, the film should impair the touch sensitivity of the surface only insignificantly, or not at all, in order to seamlessly enable touch inputs of the operator.

It can be desirable to give the user visual feedback about performed user inputs via the touch-sensitive surface, similarly as takes place due to the switch position of a mechanical switch or setting wheel. A display element separate from the surface is conceivable, but not desirable. Therefore, the touch-sensitive surface is advantageously supplemented with one or more light sources, the emitted light of which is ideally controllable depending on performed user inputs. The one or more light sources do not have to be located directly in the touch-sensitive surface, but rather can instead also be arranged in the immediate vicinity of the touch-sensitive surface or circumferentially around the touch-sensitive surface. It is thus possible to give the user visual feedback simultaneously upon a performed touch input. In addition to the light sources, a controller is accordingly provided which evaluates performed touch inputs and activates the one or more light sources in reaction thereto in order to match the light emission to the touch input.

The touch sensitivity can be implemented by various technical concepts. In the present case, an embodiment based on electrical capacitance is suitable. The touch-sensitive surface can be applied to a substrate as carrier material. In the case of a capacitive touch surface, electrodes are provided for this purpose which construct a defined structure, for example a grid structure, on the accessible substrate surface. An arrangement of the light sources, in particular LEDs, on the accessible substrate surface is not advisable since the touch surface should be as smooth or flat as possible. Against this background, it is proposed that the light sources, in particular light-emitting diodes, be arranged on the lower side of the substrate. A sufficient light transmission is to be achieved via transparent partial areas of the substrate and/or dedicated openings in the substrate in the area of the light-emitting diodes in order to thus enable a path for the emitted light of the light sources to the outside into the field of view of the operator.

The use of a mechanical setting wheel in pumps for operation has already been discussed in the introductory part. According to one preferred embodiment, such a setting wheel is to be simulated by means of the touch-sensitive surface. For this purpose, the technical means for providing the touch sensitivity are made circular, in particular ring-shaped, in order to simulate the shape of the operating surface of a setting wheel. For example, a so-called touch ring is used, the electrodes of which are arranged in a ring shape in order to be able to detect capacitive changes due to circular touch inputs. Such a touch ring is then arranged on the surface to be touched of the substrate.

The arrangement of the light sources on the substrate rear side expediently also recreates the shape of the switch to be simulated, in particular the setting wheel. Accordingly, the arrangement of the light sources is ring-shaped. The diameter of the light ring can be equal to or greater than the diameter of the touch ring. The distance of the light sources from one another can be equal or variable, for example with distance increasing or decreasing in the ring direction (clockwise or counterclockwise).

Using the above-described advantageous design, it is possible for the operator to perform circular movements as in the operation of a conventional setting wheel on the touch-sensitive surface and the current rotational position of the simulated rotating wheel is visually displayed by the light emission of the LEDs matched thereto.

Alternatively to the above embodiment of the touch-sensitive surface, a PCB flex film can also be used. Such a film comprises the required components having the desired arrangement for the shape of the touch-sensitive surface. The film ideally also comprises the required light sources in the desired arrangement.

The applied film for sealing off the touch-sensitive surface comprises transparent sections at least in some sections, in order to ensure the required light transmission in an embodiment of the invention having visual feedback. The transparent areas of the applied sealing film are ideally located here on the transparent areas of or openings in the substrate.

The applied film for sealing off is preferably made self-adhesive in order to keep the assembly process as simple and cost-effective as possible.

According to one advantageous embodiment of the pump, it is equipped with an electronics housing, which includes the required electronics for controlling the pump in its interior. A depression for accommodating the touch-sensitive surface and the film covering it can be provided on the outer surface of the electronics housing. The depression is dimensioned such that the touch-sensitive surface with the film can be embedded in the housing surface flush with the housing surface. The surface depression is expediently equipped with at least one slot for feeding through any signal and supply lines, in order to connect the touch-sensitive surface and/or the light sources to a control circuit board within the electronics housing. A flat band cable can be used for the required connecting lines. The plug connection of the substrate is located on the lower side of the substrate, ideally in the area of the at least one slot, so that the plug connection can ideally also be introduced at least partially into the slot.

The at least one touch-sensitive surface can be the sole operating element of the pump. The operating concept can however alternatively be supplemented by additional mechanical operating elements. It is conceivable, for example, that at least one mechanical operating element is a membrane button. The membrane button is preferably formed by the film for sealing off the touch-sensitive surface. The film provides a corresponding deformation, in particular a thermal deformation, or embossing for this purpose, by which a type of elastic "resilient zone" can be created to implement a minimal button stroke. The film can be of multilayered structure, at least in the area of the membrane button. The circuit to be actuated of the membrane button can be a component part of the multilayered structure of the film or can be arranged on the substrate or another carrier material. It can preferably be provided that the membrane button is formed in the middle area of the film and is surrounded by the formed touch-sensitive surface.

The pump can be designed as a centrifugal pump, preferably as an in-line centrifugal pump. Moreover, the pump can be a wet or dry rotor pump. The pump is particularly preferably embodied as a heating circulation pump.

Further advantages and properties of the invention are to be explained in more detail hereinafter on the basis of an exemplary embodiment illustrated in the figures, in which:

DETAILED DESCRIPTION

Figure 1:
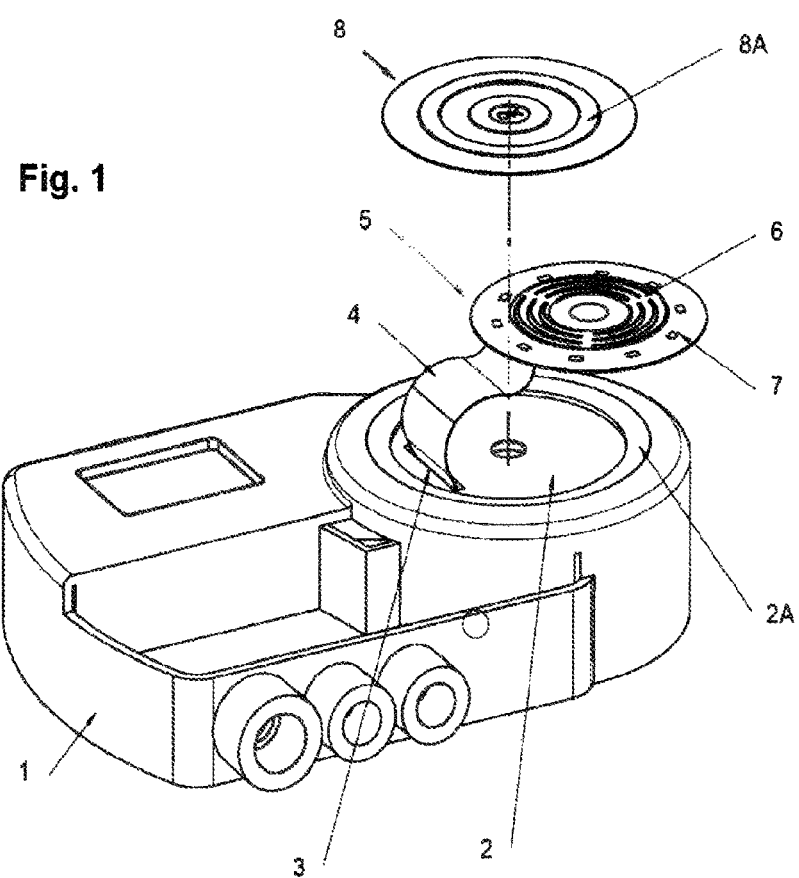
FIG. 1 shows a top view of an electronics housing component of a heating circulation pump according to an embodiment of the invention.

FIG. 1 shows the structure of the touch-sensitive user interface of a pump according to an embodiment of the invention, which is shown here by way of example as a heating circulation pump. An upper housing cover 1 of the electronics housing of the pump is visible, which in addition to an electronics circuit board 10 for the control of the user interface of the pump also contains further electronics components. Such an electronics housing is typically seated axially or radially on the motor housing of the electric-motor pump drive.

The housing cover 1 includes on its upper side, which at the same time represents an axial end of the pump in the installed position, a surface depression 2 for accommodating a substrate 5 for implementing the touch-sensitive user interface. A ring-shaped electrode arrangement 6 for measuring capacitive changes by user input via finger is arranged on the externally accessible upper side of the substrate 5. Circular touch inputs, as occur during the actuation of a mechanical setting wheel, are thus detected by the controller 10 with the aid of the electrode arrangement 6.

A plurality of light-emitting diodes 7 is arranged at uniform distance in relation to one another in a ring shape on the lower side of the substrate 5. The LED ring 7 encloses the ring-shaped electrode arrangement 6, wherein the diameter of the LED ring 7 is greater than the circumference of the electrode arrangement 6. The LEDs can emit colored light, for example blue light. Openings in the substrate 5 or transparent sections of the substrate 5 ensure sufficient light transmission of the substrate so that the light ring is externally perceivable by the user.

A plug connection on the lower side of the substrate 5 is used for contacting a flat band cable 4 in order to ensure the measurement signals of the electrode arrangement 6 and the activation of the LEDs 7 by means of the control circuit board 10. The slot 3 in the bottom of the depression 2 is used to feed through the cable 4.

It is apparent in the illustration of FIG. 1 that the depression 2 is designed having a step 2A. The deeper step forms a circular, precisely fitted accommodation surface for the substrate 5. The depression step extending in a ring shape around it is used as an adhesive surface for the self-adhesive film 8 for sealing off the substrate 5. The film 8 is applied to the inserted substrate 5 and thus adhesively bonded to the substrate 5 and the depression step 2A of the housing 1. By means of the film 8, the substrate 5 is not only sealed off, but also mechanically fixed in the depression 2. In particular, a splash water protection according to IP 44 is implemented in this way.

The material properties of the film 8 enable touch inputs via the electrode arrangement 6 of the substrate 5. A transparent ring section 8A of the film ensures the light transmission of the light emitted by the light-emitting diodes 7.

The main circuit board 10 moreover a component 11 on that is visible from the outside due to the housing passage and is used as an additional display element 11.

The user can operate the pump by circular operating inputs by way of the capacitive surface 6, wherein the handling accordingly recreates a mechanical setting wheel. At the same time, the user receives visual feedback via the light-emitting diodes 7 arranged in a ring shape, which in particular reflects the user input and thus visualizes the current setting position of the simulated setting wheel.

Figure 2:
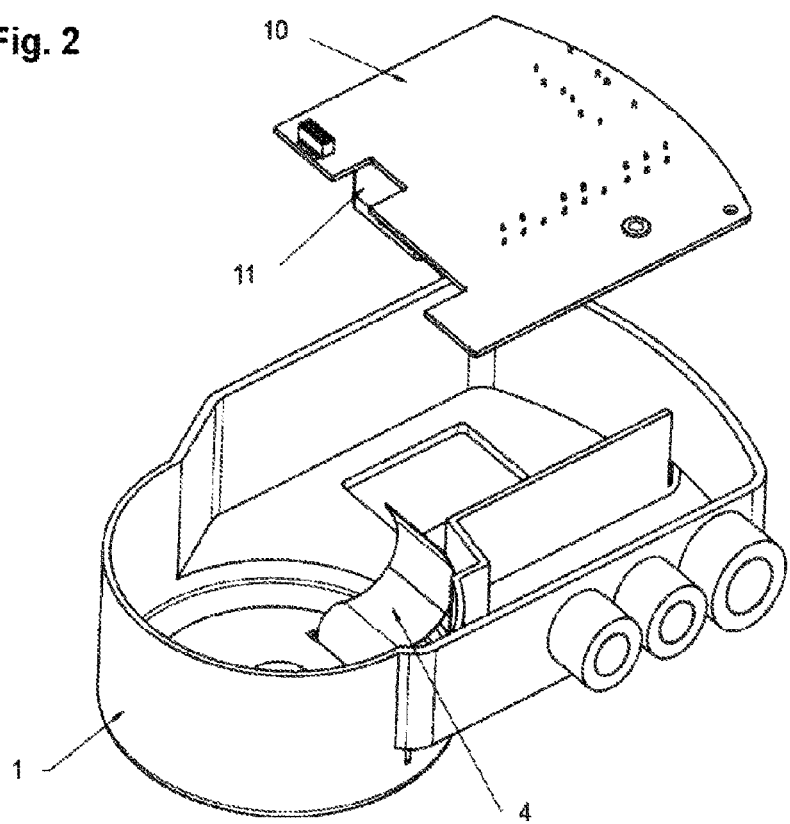
FIG. 2 shows a bottom view of the electronics housing component according to FIG. 1.
Figure 3:
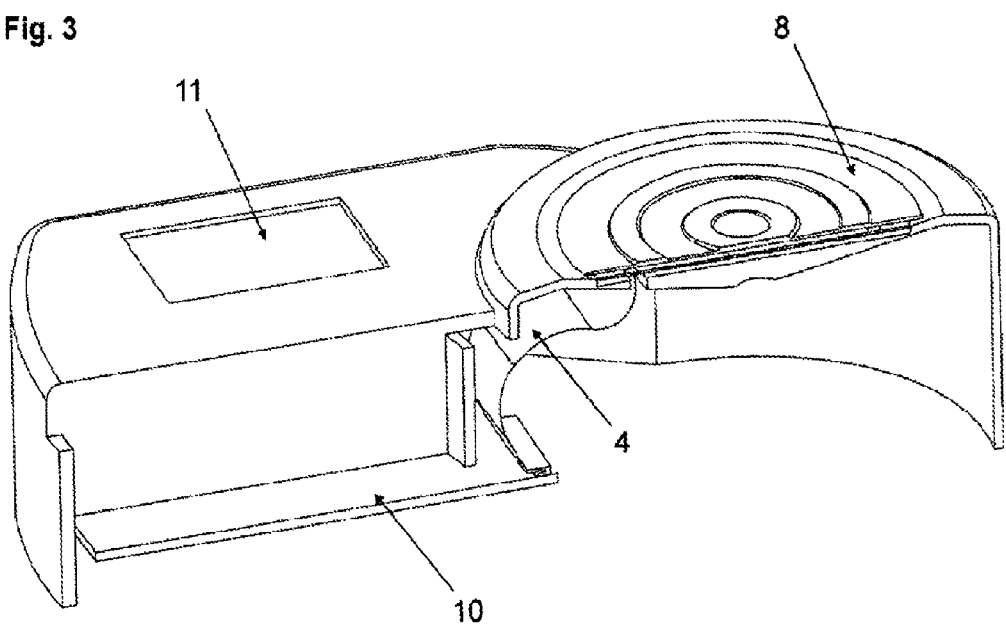
FIG. 3 shows a sectional illustration through the electronics housing component according to FIGS. 1 and 2.

Notwithstanding the embodiment of FIGS. 1-3, the substrate 5 can be replaced, for example, by a so-called flex board, which contains the required components for implementing the capacitive surface 6, on the one hand, and also any light sources 7 for the visual feedback. Such a flex board can already include the required splash protection, meaning that the film 8 could be omitted. However, this is expediently nonetheless applied to such a flex film, in order to achieve an additional seal.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

The invention claimed is:

1. A pump, comprising:
an electronics housing;
a control panel configured for one or both of manual actuation and configuration of the pump; and
a flat band cable, wherein
the control panel includes at least one touch-sensitive surface that is applied to a substrate, the substrate being a carrier material, and the at least one touch-sensitive surface being configured to receive user inputs and at least one film configured to be applied to the touch-sensitive surface and to seal off the touch-sensitive surface from the surroundings, and
the flat band cable is configured to connect the at least one touch-sensitive surface to a control circuit board inside the electronics housing.

2. The pump as claimed in claim 1, wherein
the touch-sensitive surface includes one or more light sources, and
the one or more light sources are arranged in an area around the touch-sensitive surface such that the one or more light sources generate a visual feedback signal in response to a user input.

3. The pump as claimed in claim 2, wherein
the one or more light sources includes light-emitting diodes.

4. The pump as claimed in claim 3, wherein
the touch-sensitive surface has a surface accessible to the user with components.

5. The pump as claimed in claim 4, wherein
the components for implementing touch sensitivity include electrodes of a capacitive surface, and
the at least one light source is arranged on a rear side of the substrate.

6. The pump as claimed in claim 5, wherein
the substrate includes one or both of a transparent area and a recess in the area of at least one of the one or more light sources.

7. The pump as claimed in claim 6, wherein
one or both of the touch-sensitive surface and the arrangement of the one or more light sources is ring configured to simulate a positioning wheel.

8. The pump as claimed in claim 1, wherein
the touch-sensitive surface includes a PCB flex board and the one or more light sources, and
one or both of the touch-sensitive surface and one or more light sources is ring-shaped.

9. The pump as claimed in claim 1, wherein
the at least one film is transparent at least in some sections,
the touch-sensitive surface is formed by a substrate having a surface accessible to the user with components, and
the transparent sections correspond to the arrangement of the one or more light sources, and/or covers a transparent area of the substrate, or both.

10. The pump as claimed in claim 1, wherein
the at least one film is self-adhesive.

11. The pump as claimed in claim 1, wherein
the film seals off the touch-sensitive surface splash water at least according to a rating of IP44.

12. The pump as claimed in claim 1, further comprising:
an electronics housing having a surface depression configured to receive the at least one touch-sensitive surface.

13. The pump as claimed in claim 12, wherein
the surface depression includes at least one slot.

14. The pump as claimed in claim 13, wherein
the touch-sensitive surface includes a PCB flex board and the one or more light sources, and
the flat band cable contacts the at least one touch-sensitive surface on a side facing the surface depression, the flex board, or both.

15. The pump as claimed in claim 1, wherein
the one or both of manual actuation and configuration of the pump is available solely via the one or more touch-sensitive surfaces.

16. The pump as claimed in claim 1, further comprising:
at least one mechanical input is provided.

17. The pump as claimed in claim 16, wherein
the mechanical input is a membrane button formed in by a deformation or embossing of the at least one film.

18. The pump as claimed in claim 1, wherein
the pump is a centrifugal pump.

19. The pump as claimed in claim 18, wherein
the centrifugal pump is an in-line centrifugal pump.

20. The pump as claimed in claim 19, wherein
the in-line centrifugal pump is a heating circulation pump.

21. A pump, comprising:
a control panel configured for one or both of manual actuation and configuration of the pump;
an electronics housing having a surface depression configured to receive the at least one touch-sensitive surface, wherein
the control panel includes at least one touch-sensitive surface that is configured to receive user inputs and at least one film configured to be applied to the touch-sensitive surface and to seal off the touch-sensitive surface from the surroundings,
the surface depression includes at least one slot, and
a flat band cable configured to pass through the slot and connect the at least one touch-sensitive surface to a control circuit board inside the electronics housing.

* * * * *